(12) United States Patent
Chiu et al.

(10) Patent No.: US 10,665,555 B2
(45) Date of Patent: May 26, 2020

(54) TRANSITION STRUCTURE AND HIGH-FREQUENCY PACKAGE

(71) Applicant: WIN Semiconductors Corp., Tao Yuan (TW)

(72) Inventors: Jui-Chieh Chiu, Taoyuan (TW); Chih-Wen Huang, Taoyuan (TW); Chen-Yang Hsieh, Taoyuan (TW); You-Cheng Lai, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 51 days.

(21) Appl. No.: 15/890,360

(22) Filed: Feb. 7, 2018

(65) Prior Publication Data
US 2019/0244917 A1 Aug. 8, 2019

(51) Int. Cl.
*H01L 23/66* (2006.01)
*H01L 23/495* (2006.01)
*H01L 23/498* (2006.01)

(52) U.S. Cl.
CPC .......... *H01L 23/66* (2013.01); *H01L 23/4952* (2013.01); *H01L 23/49541* (2013.01); *H01L 23/49838* (2013.01); *H01L 2223/6611* (2013.01); *H01L 2223/6627* (2013.01); *H01L 2224/04042* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,639,322 B1* | 10/2003 | Welstand | ............. | H01L 21/563 257/728 |
| 9,515,032 B1* | 12/2016 | Huang | .................... | H01L 23/66 |
| 9,653,408 B2 | 5/2017 | Huang | | |
| 9,673,152 B2 | 6/2017 | Huang | | |
| 2001/0032740 A1* | 10/2001 | Kennedy | ........... | H01L 23/49805 174/262 |
| 2004/0066549 A1* | 4/2004 | Kiehne | ................. | G02F 1/0316 359/254 |
| 2004/0174228 A1* | 9/2004 | Kanno | .................... | H01L 23/66 333/34 |
| 2005/0285234 A1* | 12/2005 | Kanno | .................... | H01L 23/66 257/664 |
| 2012/0114340 A1* | 5/2012 | Sugiyama | ............ | G02B 6/4201 398/200 |
| 2018/0108965 A1* | 4/2018 | Huang | .................... | H01P 3/003 |

FOREIGN PATENT DOCUMENTS

| | | |
|---|---|---|
| CN | 106449582 A | 2/2017 |
| TW | 200742164 | 11/2007 |
| TW | 201501251 A | 1/2015 |

* cited by examiner

*Primary Examiner* — Nduka E Ojeh
(74) *Attorney, Agent, or Firm* — Winston Hsu

(57) ABSTRACT

A transition structure disposed in a package is disclosed. The transition structure comprises a first ground lead and a second ground lead; and a signal lead, disposed between the first ground lead and the second ground lead, wherein the first ground lead and the second ground lead have an exterior edge and an interior edge, the signal lead is coupled to a metal line formed on a printed circuit board (PCB) and a signal terminal of the die within the package; wherein an exterior gap formed between the first ground lead and the second ground lead at the exterior edge is wider than an interior gap formed between the first ground lead and the second ground lead at the interior edge.

12 Claims, 5 Drawing Sheets

TRANSITION STRUCTURE AND HIGH-FREQUENCY PACKAGE

BACKGROUND OF THE INVENTION

1. Field of the Invention

The present invention relates to a transition structure and a high-frequency package, and more particularly, to a transition structure and a high-frequency package capable of achieving better radio-frequency performance.

2. Description of the Prior Art

Future mobile communication systems and satellite communication systems are usually required to operate at high frequencies. However, a traditional package is not customized for the high-frequency operation. Significant loss is caused at high frequencies, and degrades performance of the package.

Designing the lead frame of the package as transmission line has been developed in the art. In the prior art, ground leads and a signal lead of the lead frame is designed to form a coplanar waveguide (CPW) or a ground-signal-ground (GSG) structure. However, a signal path outside the package is usually implemented in microstrip line, and radio frequency (RF) signals are forced to be turned into CPW structure at an exterior edge of the package, which may degrade RF performance.

Therefore, it is necessary to improve the prior art.

SUMMARY OF THE INVENTION

It is therefore a primary objective of the present invention to provide a transition structure and a high-frequency package capable of achieving better radio-frequency performance, to improve over disadvantages of the prior art.

An embodiment of the present invention discloses a transition structure disposed in a package. The transition structure comprises a first ground lead and a second ground lead; and a signal lead, disposed between the first ground lead and the second ground lead, wherein the first ground lead and the second ground lead have an exterior edge and an interior edge, the signal lead is coupled to a metal line formed on a printed circuit board (PCB) and a signal terminal of the die within the package; wherein an exterior gap formed between the first ground lead and the second ground lead at the exterior edge is wider than an interior gap formed between the first ground lead and the second ground lead at the interior edge.

An embodiment of the present invention further discloses a high-frequency package disposed on a printed circuit board (PCB). The package comprises a die paddle; a die, disposed on a die paddle; and a transition structure. The transition structure comprises a first ground lead and a second ground lead; and a signal lead, disposed between the first ground lead and the second ground lead, wherein the first ground lead and the second ground lead have an exterior edge and an interior edge, the signal lead is coupled to a metal line formed on a printed circuit board (PCB) and a signal terminal of the die within the package; wherein an exterior gap formed between the first ground lead and the second ground lead at the exterior edge is wider than an interior gap formed between the first ground lead and the second ground lead at the interior edge.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
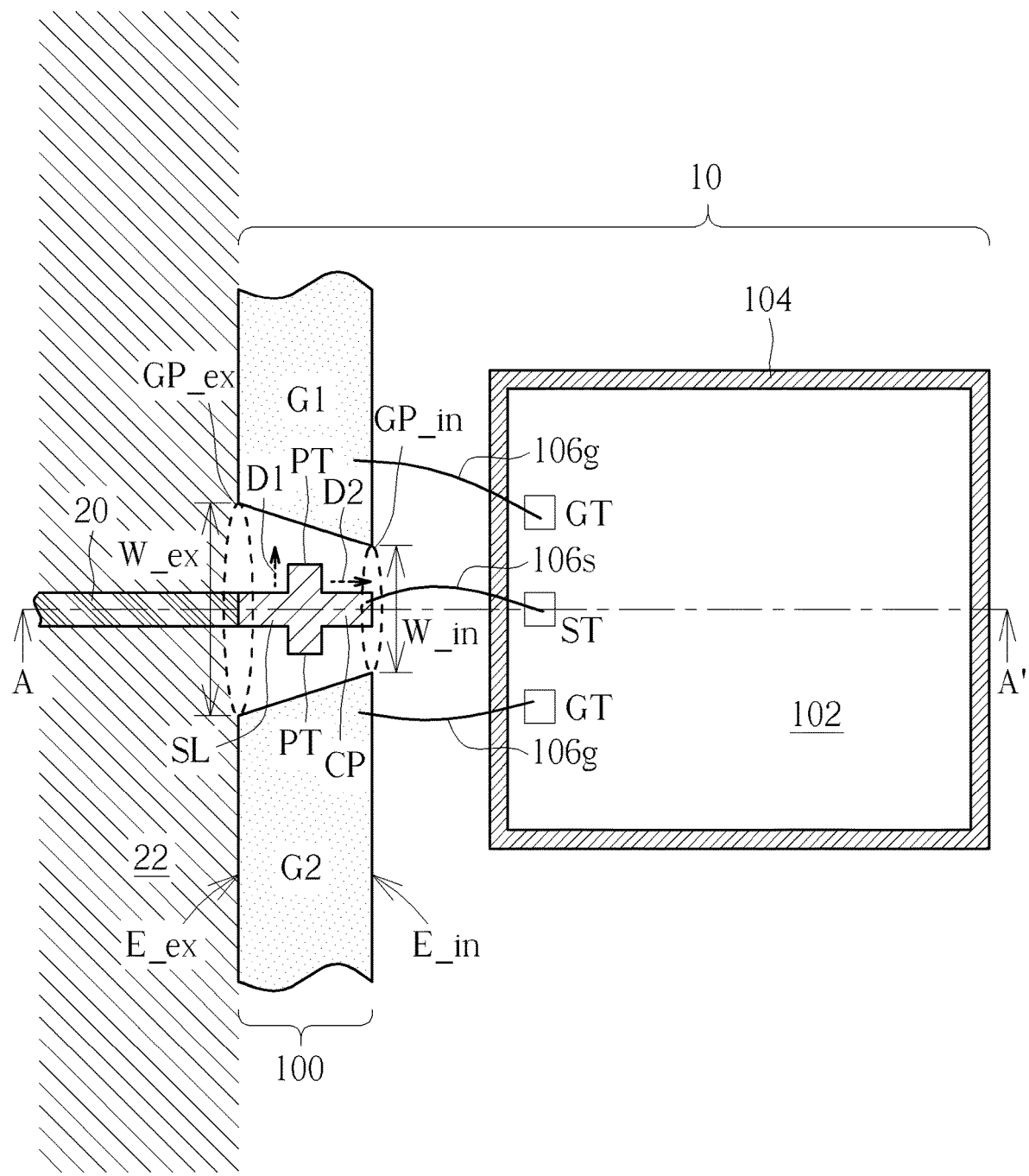
FIG. 1 is a schematic diagram of a top view of a high-frequency package according to an embodiment of the present invention.
Figure 2:
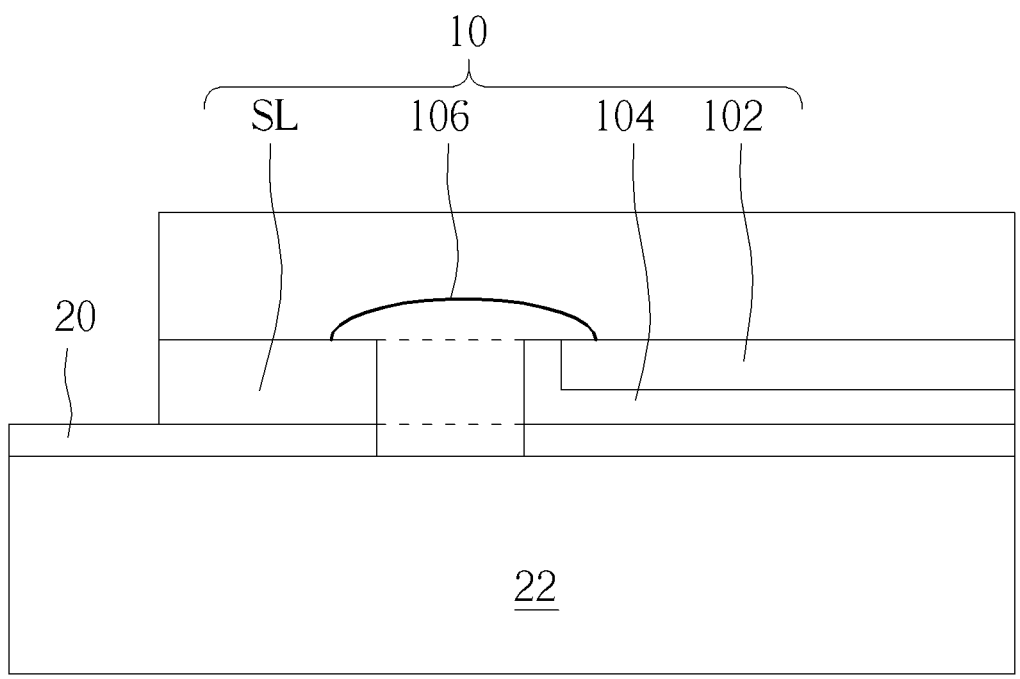
FIG. 2 is a schematic diagram of a sectional side view of the high-frequency package illustrated in FIG. 1.

FIG. 1 is a schematic diagram of a top view of a high-frequency package 10 according to an embodiment of the present invention. FIG. 2 is a schematic diagram of a sectional side view of the high-frequency package 10 along an A-A' line in FIG. 1. The high-frequency package 10 is disposed on a transmission line carrier 22, on which a metal line 20 is formed. The transmission line carrier 22 may be a printed circuit board (PCB), a ceramic substrate, a semiconductor substrate, or a laminate PCB, which is not limited thereto. The metal line 20 is configured to deliver a radio frequency (RF) signal. The high-frequency package 10 comprises a transition structure 100, a die 102 and a die paddle 104. The transition structure 100 is disposed on a side of the high-frequency package 10. The die 102 is disposed on the die paddle 104 within the high-frequency package 10. For illustrative purpose, FIG. 1 only illustrates a part of the high-frequency package 10, and the transmission line carrier 22 being a PCB is taken as an example in the following description.

The transition structure 100, formed as a transmission line, comprises a signal lead SL and ground leads G1 and G2. The ground leads G1 and G2 are electrically connected to ground terminals GT of the die 102 through grounding bonding wires 106g. The ground leads G1 and G2 have an exterior edge E_ex and an interior edge E_in. The exterior edge E_ex may be a surrounding surface of the high-frequency package 10, and the interior edge E_in is inside the high-frequency package 10. That is, the interior edge E_in, compared to the exterior edge E_ex, is closer to the die 102. On the other hand, the signal lead SL is disposed between the ground lead G1 and the ground lead G2. The signal lead SL is electrically connected to the metal line 20 formed on the PCB 22, to deliver the RF signal to/from the high-frequency package 10. In addition, the signal lead SL is electrically connected to a signal terminal ST of the die 102 through a signal bonding wire 106s. Notably, for RF performance consideration, the die paddle 104 may be connected to the first ground G1 and the second ground G2 to improve RF grounding performance. In addition, the grounding bonding wires 106g connecting the ground leads G1 and G2 and the signal bonding wires 106s connecting the signal lead SL would build a ground-signal-ground (GSG) structure, which connects the die 102 to keep RF performance better.

At the exterior edge E_ex, an exterior gap GP_ex is formed between the ground lead G1 and the ground lead G2, where the exterior gap GP_ex has a width W_ex. At the interior edge E_in, an interior gap GP_in is formed between the ground lead G1 and the ground lead G2, where the interior gap GP_in has a width W_in. Notably, the exterior gap GP_ex is wider than the interior gap GP_in, i.e., the width W_ex is wider than the width W_in. In addition, a gap between the ground leads G1 and G2 become narrower gradually from the exterior edge E_ex to the interior edge E_in.

In addition, the signal lead SL comprises a central portion CP and protrusions PT. The protrusions PT protrude toward a first direction D1 from the central portion CP to form a capacitance, where the first direction D1 is parallel to the exterior edge E_ex or the interior edge E_in. Details of the protrusion PT of the die 102 are referred to U.S. patent application Ser. No. 14/883,635 filed by the applicant, which is not narrated herein for brevity. The central portion CP may be in a strip shape, in which long sides of the portion CP are perpendicular to the first direction D1 and parallel to a second direction D2, where the second direction D2 represents a direction from the exterior edge E_ex to the interior edge E_in and is perpendicular to the first direction D1. Notably, a distance between the central portion CP and the ground lead G1/G2 at the first direction D1 is in a descending trend from the exterior edge E_ex to the interior edge E_in. That is, the distance between the central portion CP and the ground lead G1/G2 at the first direction D1 decreases from the exterior edge E_ex to the interior edge E_in.

Figure 3:
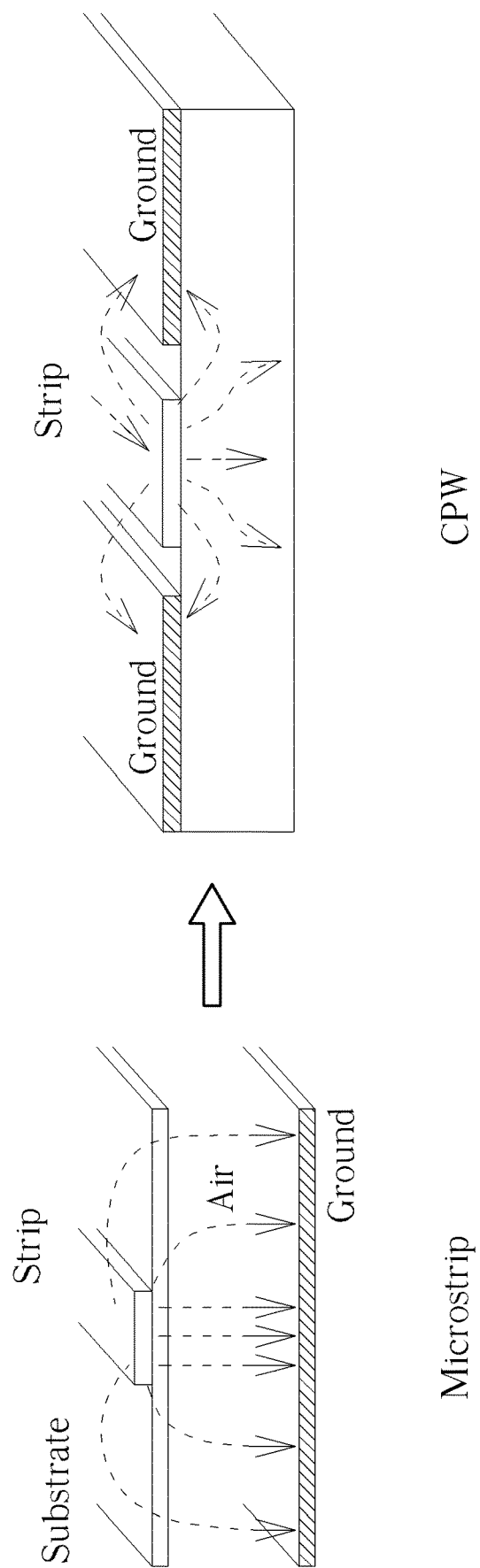
FIG. 3 is a schematic diagram of line of magnetic field of a microstrip line and a coplanar waveguide (CPW).

Notably, the transition structure 100, as the transmission line, is configured to gradually transform a microstrip line structure into a coplanar waveguide (CPW) with GSG structure. Specifically, an exterior end of the signal lead SL may form the microstrip line structure; while an interior end of the signal lead SL along with the ground leads G1 and G2 may form the CPW structure or the GSG structure. In detail, please refer to FIG. 3 to see line of magnetic field of the microstrip line structure and the CPW/GSG structure. In the left subfigure of FIG. 3, the strip may represent the exterior end of the signal lead SL; while the right subfigure of FIG. 3, the strip may represent the interior end of the signal lead SL, and the grounds may represent the ground leads G1 and G2. Referring back to FIG. 1, at the exterior end of the signal lead SL, since the ground leads G1 and G2 are far from the signal lead SL, the line of magnetic field would fall down to a ground below the PCB 20 (not shown in FIG. 1), which is similar to the left subfigure of FIG. 3. Thus, the exterior end of the signal lead SL forms the microstrip line structure. From the exterior end (the exterior edge E_ex) to the interior end (the interior edge E_in), the gap between the ground leads G1 and G2 becomes narrower gradually. At the interior end of the signal lead SL, the ground leads G1 and G2 are sufficiently close to the signal lead SL, and the line of magnetic field would be risen and directed to the ground leads G1 and G2 coplanar with the signal lead SL, which is similar to the right subfigure of FIG. 3. Thus, the interior end of the signal lead SL along with the ground leads G1 and G2 may form the CPW structure or the GSG structure. Furthermore, since the metal line 20 formed on the PCB 22 is substantially in the microstrip line structure, the transition structure 100 disposed within the package 10 gradually transforms the line of magnetic field from a microstrip line manner to a CPW/GSG manner. Therefore, the transition structure 100 gradually transforms from the microstrip line structure to the CPW/GSG structure.

In addition, referring back to FIG. 2, to lower inductive effect caused by contact of the bonding wire(s) with the mold material of the high-frequency package 10, a length of the bonding wire(s) has to be shortened as possible. To achieve that, the die paddle 104 may be formed (e.g., by etching) such that a top surface of the die 102 is aligned/coplanar with a top surface of the lead (i.e., the signal lead SL or the ground lead G1/G2). In an embodiment, a notched area may be formed on/within the die paddle 104, and the die 102 may be disposed within the notched area, such that the top surface of the die 102 is able to be coplanar with the top surface of the signal lead SL or the top surface of the ground lead G1/G2. Details of the coplanar property of the top surfaces of the die 102 and the leads are referred to U.S. patent application Ser. No. 14/883,609 filed by the applicant, which is not narrated herein for brevity.

Figure 4:
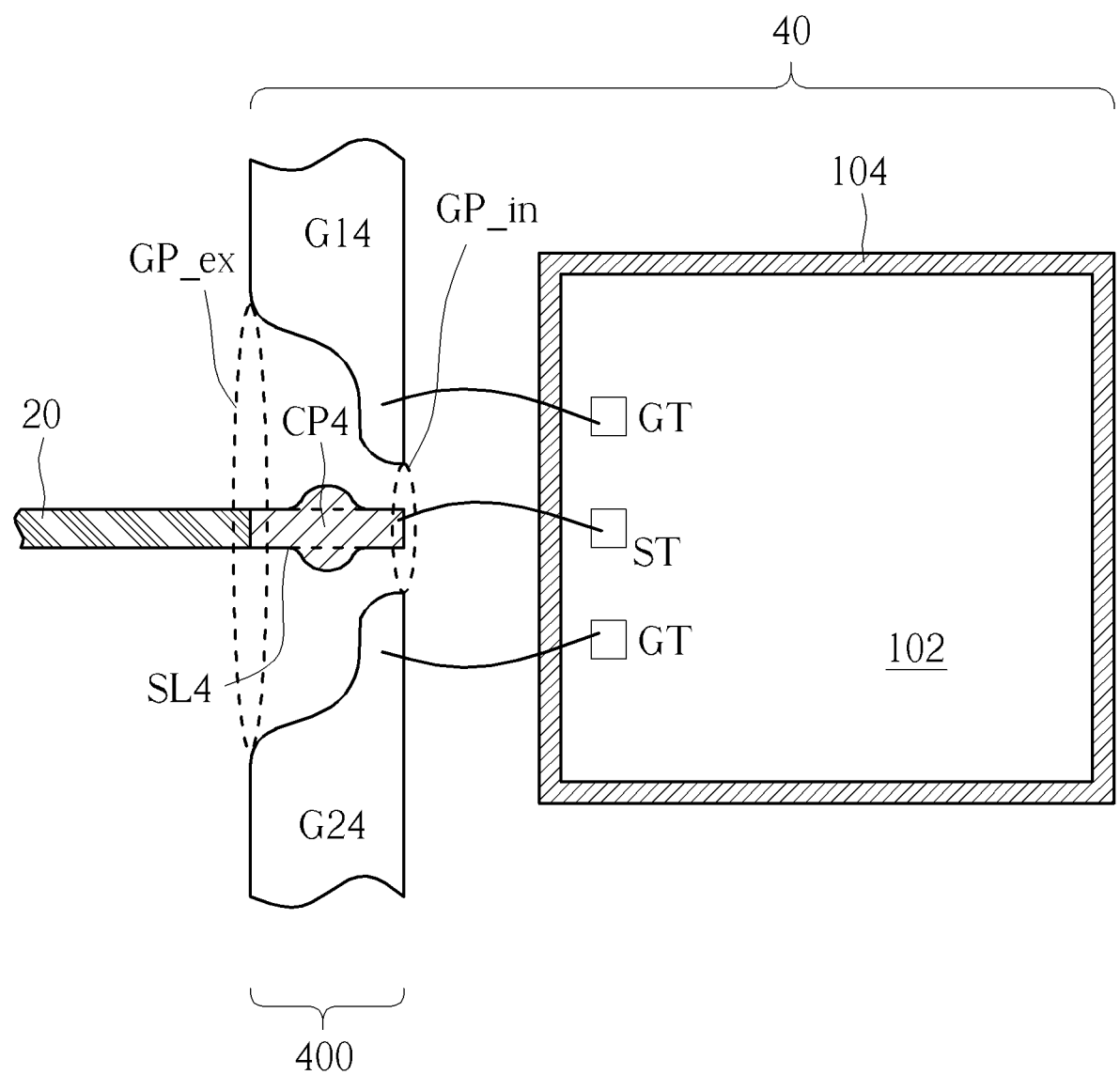
FIG. 4 is a schematic diagram of a top view of a high-frequency package according to an embodiment of the present invention.

Notably, the embodiments stated in the above are utilized for illustrating the concept of the present invention/application. Those skilled in the art may make modifications and alterations accordingly, and not limited herein. For example, shapes of the ground leads and the signal lead are not limited. Please refer to FIG. 4, which is a schematic diagram of a high-frequency package 40 according to an embodiment of the present invention. The high-frequency package 40 is similar to the high-frequency package 10, and thus, the symbol components are denoted by the same denotations. Different from the high-frequency package 10, shapes of ground leads G14 and G24 and a signal lead SL4 of a transition structure 400 within the high-frequency package 40 are different from those of the transition structure 100 within the high-frequency package 10. As long as the exterior gap GP_ex is wider than the interior gap GP_in, requirements of the present invention are satisfied.

Figure 5:
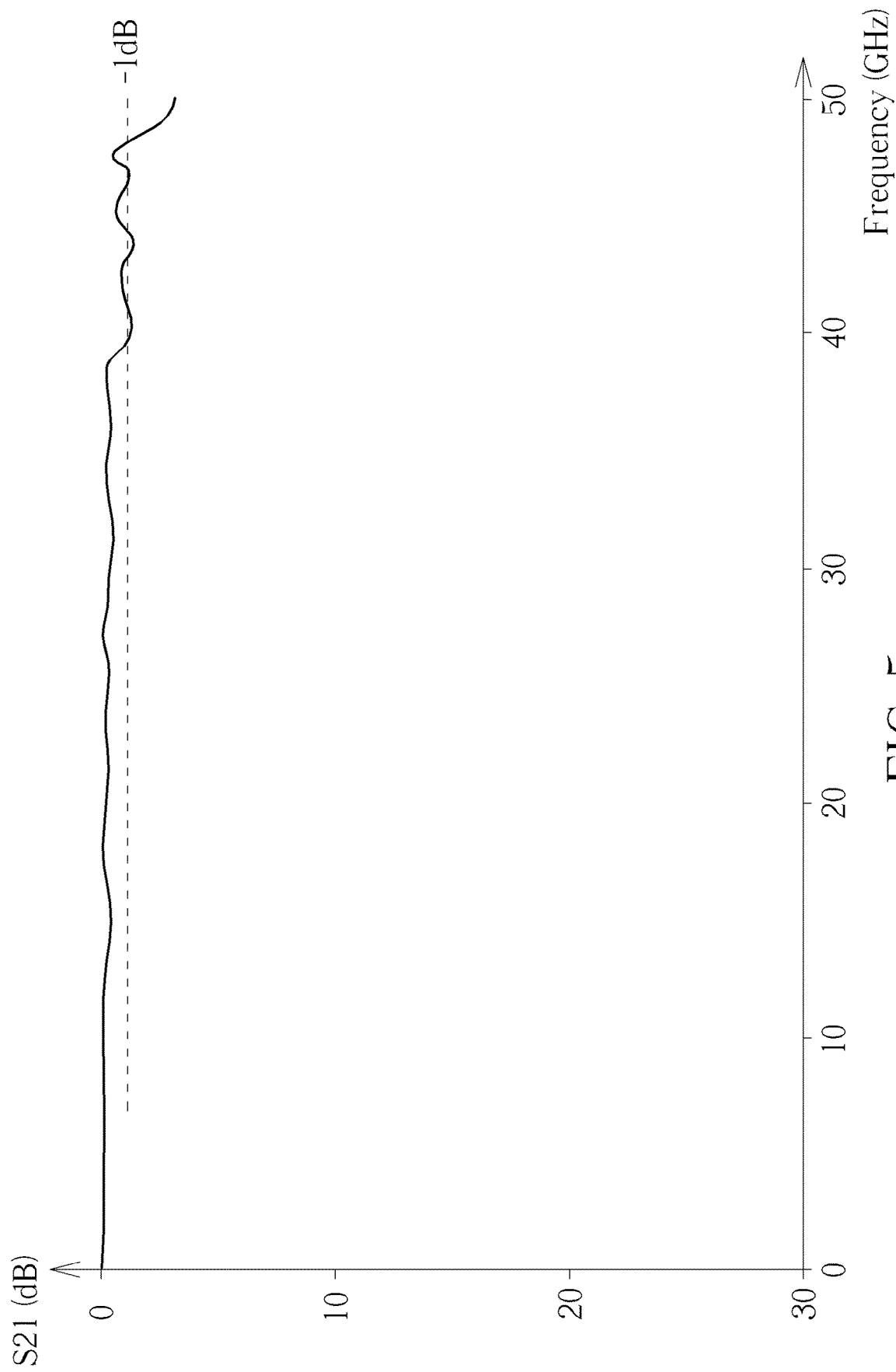
FIG. 5 is a frequency response diagram of insertion loss of the high-frequency package of the present invention.

Furthermore, please refer to FIG. 5 to see the frequency response of insertion loss of the high-frequency package of the present invention. As can be seen from FIG. 5, a characteristic frequency (at which the insertion loss is 1 dB) of the high-frequency package of the present invention is extended to 41 GHz, which is higher than 31 GHz, the characteristic frequency of U.S. application Ser. Nos. 14/883,609 and 14/883,635. In other words, the high-frequency package of the present invention achieves better RF performance over the prior art.

In summary, the present invention utilizes the transition structure, with the wider exterior edge compared to the interior edge of the ground leads, to transform the microstrip line structure into the CPW/GSG structure, so as to achieves better RF performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transition structure, disposed in a package, the transition structure comprising:
   a first ground lead and a second ground lead; and
   a signal lead, disposed between the first ground lead and the second ground lead, wherein the first ground lead and the second ground lead have an exterior edge and an interior edge, the signal lead is coupled to a metal line formed on a transmission line carrier and a signal terminal of a die within the package;
   wherein the signal lead directly contacts the metal line formed on the transmission line carrier;
   wherein an exterior gap formed between the first ground lead and the second ground lead at the exterior edge is wider than an interior gap formed between the first ground lead and the second ground lead at the interior edge;

wherein the exterior edge of the first ground lead is at an edge of the package;

wherein the signal lead reaches the edge of the package;

wherein the signal lead, the first ground lead and the second ground lead reach a bottom edge of the package;

wherein from the signal lead to the bottom edge of the package is solid metal;

wherein from the first ground lead to the bottom edge of the package is solid metal;

wherein from the second ground lead to the bottom edge of the package is solid metal;

wherein an exterior end of the signal lead at the exterior edge forms a microstrip line, a gap between the first ground lead and the second ground lead is gradually narrower from the exterior edge to the interior edge, such that an interior end of the signal lead along with the first ground lead and the second ground lead at the interior edge form a coplanar waveguide (CPW).

2. The transition structure of claim 1, wherein the signal lead comprises a protrusion protruding toward a first direction from a central portion of the signal lead to form a capacitance, and the first direction is parallel to the interior edge or the exterior edge.

3. The transition structure of claim 1, wherein the signal lead comprises a central portion, and a distance between the central portion and the first ground lead decreases from the exterior edge to the interior edge.

4. The transition structure of claim 1, wherein the transmission line carrier is a printed circuit board (PCB), a ceramic substrate, a semiconductor substrate or a laminate PCB.

5. The transition structure of claim 1, wherein the metal line is interposed between the signal lead and the transmission line carrier.

6. A high-frequency package, disposed on a transmission line carrier, the package comprising:
  a die paddle;
  a die, disposed on the die paddle; and
  a transition structure, comprising:
    a first ground lead and a second ground lead; and
    a signal lead, disposed between the first ground lead and the second ground lead, wherein the first ground lead and the second ground lead have an exterior edge and an interior edge, the signal lead is coupled to a metal line formed on the transmission line carrier and a signal terminal of the die within the package;
    wherein the signal lead directly contacts the metal line formed on the transmission line carrier;
    wherein an exterior gap formed between the first ground lead and the second ground lead at the exterior edge is wider than an interior gap formed between the first ground lead and the second ground lead at the interior edge;
    wherein the exterior edge of the first ground lead is at an edge of the package;
    wherein the signal lead reaches the edge of the package;
    wherein the signal lead, the first ground lead and the second ground lead reach a bottom edge of the package;
    wherein from the signal lead to the bottom edge of the package is solid metal;
    wherein from the first ground lead to the bottom edge of the package is solid metal;
    wherein from the second ground lead to the bottom edge of the package is solid metal;
    wherein an exterior end of the signal lead at the exterior edge forms a microstrip line, a gap between the first ground lead and the second ground lead is gradually narrower from the exterior edge to the interior edge, such that an interior end of the signal lead along with the first ground lead and the second ground lead at the interior edge form a coplanar waveguide (CPW).

7. The high-frequency package of claim 6, wherein the first ground lead and the second ground lead are connected to the die through grounding bounding wires, the signal lead is connected to the die through a signal bonding wire, and the grounding bounding wires and the signal bonding wire form a ground-signal-ground (GSG) structure.

8. The high-frequency package of claim 6, wherein the signal lead comprises a protrusion protruding toward a first direction from a central portion of the signal lead to form a capacitance, and the first direction is parallel to the interior edge or the exterior edge.

9. The high-frequency package of claim 6, wherein the signal lead comprises a central portion, and a distance between the central portion and the first ground lead decreases from the exterior edge to the interior edge.

10. The high-frequency package of claim 6, wherein a top surface of the die is coplanar with a top surface of the signal lead.

11. The high-frequency package of claim 6, wherein the die paddle is connected to the first ground lead and the second ground lead.

12. The high-frequency package of claim 6, wherein the transmission line carrier is a printed circuit board (PCB), a ceramic substrate, a semiconductor substrate or a laminate PCB.

* * * * *